United States Patent
Shi

(10) Patent No.: US 10,410,564 B2
(45) Date of Patent: Sep. 10, 2019

(54) DISPLAY DEVICE AND GOA CIRCUIT THEREOF

(71) Applicant: Shenzhen China Star Optoelectronics Semiconductor Display Technology Co., Ltd., Shenzhen, Guangdong (CN)

(72) Inventor: Longqiang Shi, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 54 days.

(21) Appl. No.: 15/739,746

(22) PCT Filed: Sep. 20, 2017

(86) PCT No.: PCT/CN2017/102353
§ 371 (c)(1),
(2) Date: Dec. 24, 2017

(87) PCT Pub. No.: WO2018/188272
PCT Pub. Date: Oct. 18, 2018

(65) Prior Publication Data
US 2018/0322819 A1    Nov. 8, 2018

(30) Foreign Application Priority Data
Apr. 11, 2017 (CN) .......................... 2017 1 0233389

(51) Int. Cl.
*G09G 3/20*      (2006.01)
*H01L 27/12*     (2006.01)
(Continued)

(52) U.S. Cl.
CPC ............... *G09G 3/20* (2013.01); *G11C 19/28* (2013.01); *H01L 27/124* (2013.01);
(Continued)

(58) Field of Classification Search
CPC ...... G09G 3/20; G09G 3/36; G09G 2330/021; G09G 2310/0267; G09G 3/2092
See application file for complete search history.

(56) References Cited

U.S. PATENT DOCUMENTS

2001/0019125 A1*   9/2001   Hong .................... G02F 1/1362
                                                                                                                       257/59
2001/0025959 A1*   10/2001   Yamazaki ........... H01L 27/3272
                                                                                                                       257/72
(Continued)

FOREIGN PATENT DOCUMENTS

CN         101067705    *   7/2007  ........... G02F 1/1362
CN         104965364 A     10/2015
(Continued)

*Primary Examiner* — Olga V Merkoulova
(74) *Attorney, Agent, or Firm* — Andrew C. Cheng

(57) ABSTRACT

This disclosure discloses a display device and a GOA circuit thereof. The GOA circuit includes a plurality of thin film transistors, and the thin film transistors are disposed on a substrate, and the thin film transistor includes at least a metal shading layer and a semiconductor layer sequentially arranged on the substrate, and the metal shading layers of the plurality of thin film transistors are all input in ground signal. This disclosure can avoid the coupling effect of the metal shading layer and ensure the normal output signal of the GOA circuit.

13 Claims, 2 Drawing Sheets

(51) Int. Cl.
 *H01L 29/786* (2006.01)
 *G11C 19/28* (2006.01)
 *G09G 3/36* (2006.01)

(52) U.S. Cl.
 CPC ...... *H01L 27/1225* (2013.01); *H01L 29/7869* (2013.01); *H01L 29/78633* (2013.01); *G09G 3/3674* (2013.01); *G09G 2310/0264* (2013.01); *G09G 2310/0286* (2013.01)

(56) References Cited

U.S. PATENT DOCUMENTS

| | | | |
|---|---|---|---|
| 2002/0105033 A1* | 8/2002 | Zhang | H01L 27/1214 257/353 |
| 2006/0008932 A1* | 1/2006 | Oh | G02F 1/13454 438/34 |
| 2006/0073645 A1* | 4/2006 | Lee | H01L 21/32134 438/151 |
| 2008/0149937 A1 | 6/2008 | Moriwaki | |
| 2009/0152562 A1* | 6/2009 | Yang | G02F 1/13454 257/72 |
| 2011/0018001 A1 | 1/2011 | Tsai et al. | |
| 2013/0037815 A1 | 2/2013 | Okajima et al. | |
| 2015/0301415 A1 | 10/2015 | Sawada et al. | |
| 2016/0202534 A1* | 7/2016 | Chen | G02F 1/1368 349/43 |
| 2017/0162151 A1 | 6/2017 | Cao | |
| 2018/0197931 A1* | 7/2018 | Liang | H01L 27/3274 |

FOREIGN PATENT DOCUMENTS

| | | |
|---|---|---|
| CN | 106206622 A | 12/2016 |
| CN | 107134460 A | 9/2017 |

\* cited by examiner

DISPLAY DEVICE AND GOA CIRCUIT THEREOF

TECHNICAL FIELD

This disclosure relates to the field of display technology, and more particularly to a display device and a GOA (Gate Driver on Array) circuit thereof.

BACKGROUND OF RELATED ART

At present, the GOA circuit usually uses a top gate structure of the thin film transistor (Top gate IGZO TFT), wherein the source and gate and the drain and gate of the top gate structure of the thin film transistor are not overlapping parts, so the thin film transistor parasitic capacitance is small.

Since the semiconductor layer of the thin film transistor has no gate for light blocking, the semiconductor layer is seriously affected by the light, thereby causing the electrical failure of the semiconductor layer.

SUMMARY

The technical problem that this disclosure mainly solves is to provide a display device and a GOA circuit thereof, which can avoid the electrical failure of the semiconductor layer and avoid the coupling effect of the metal shading layer.

To solve the above technical problem, a technical proposal of this disclosure is to provide a GOA circuit including a plurality of thin film transistors disposed on a substrate, the thin film transistor including at least a metal shading layer and a semiconductor layer sequentially arranged on the substrate, the metal shading layers of the plurality of thin film transistors are all input in ground signal, the metal light-shading layers of the plurality of thin film transistors are connected together; the semiconductor layer is an IGZO layer, and the thin film transistor further includes:

an insulating layer, disposed on the substrate, the metal shading layer and the IGZO layer;

a gate layer, disposed on the insulating layer;

an interlayer dielectric layer, disposed on the gate layer and the insulating layer; and a source layer and a drain layer, disposed on the interlayer dielectric layer;

wherein the interlayer dielectric layer and the insulating layer are provided with a first through hole and a second through hole, the source layer is connected with the IGZO layer through the first through hole, and the second through hole is connected with the IGZO layer.

To solve the above technical problem, another technical proposal of this disclosure is to provide a GOA circuit including a plurality of thin film transistors disposed on a substrate, the thin film transistor includes at least a metal shading layer and a semiconductor layer sequentially arranged on the substrate, the metal shading layers of the plurality of thin film transistors are all input in ground signal.

To solve the above technical problem, another technical proposal of this disclosure is to provide a display device, including a GOA circuit, applied to generate a drive signal, the GOA circuit including a plurality of thin film transistors, the thin film transistors are disposed on a substrate, the thin film transistor including at least a metal shading layer and a semiconductor layer sequentially arranged on the substrate, the metal shading layers of the plurality of thin film transistors are all input in ground signal.

The beneficial effect of the disclosure is that different from the prior art, the thin film transistor includes at least a metal shading layer and a semiconductor layer sequentially arranged on the substrate, the metal shading layer is applied to block light for the semiconductor layer, thereby avoiding the electrical failure of the semiconductor layer; the metal shading layers of the plurality of thin film transistor are all input ground signal, which can avoid the coupling effect of the metal shading layer and ensure the GOA circuit to output signals normally.

DETAILED DESCRIPTION OF EMBODIMENTS

The following sections offer a clear, complete description of this disclosure in combination with the embodiments and accompanying drawings. Obviously, the embodiments described herein are only a part of, but not all of the embodiments of this disclosure. In view of the embodiments described herein, any other embodiment obtained by those of ordinary skill in the art skilled in this art without offering creative effort is included in a scope claimed by this disclosure.

Figure 1:
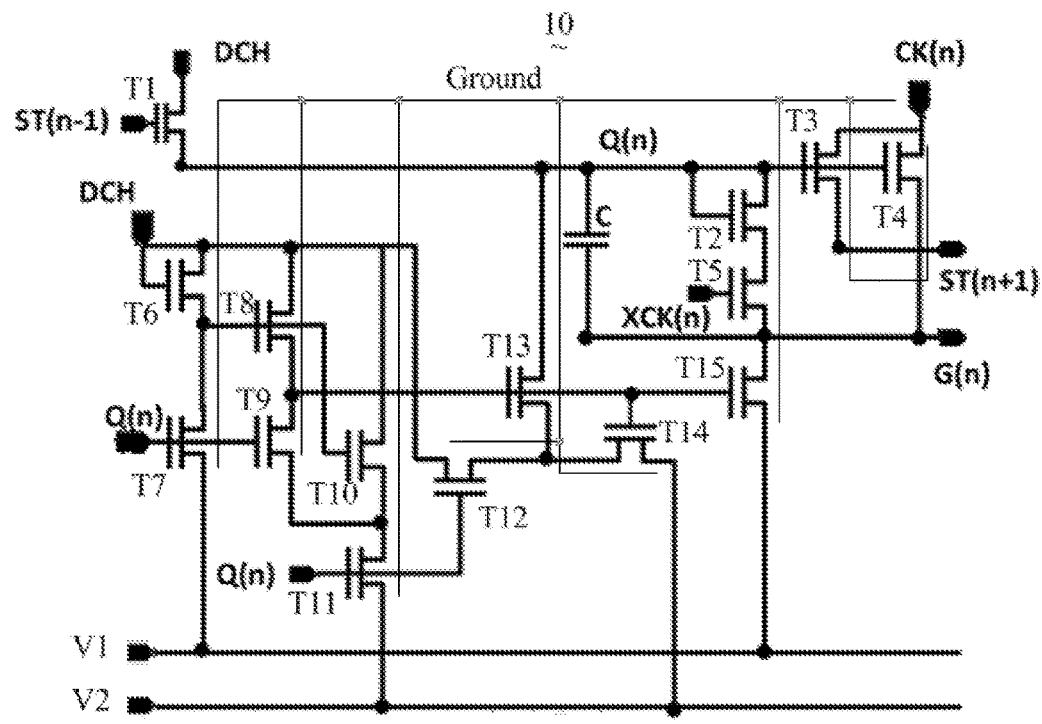
FIG. 1 is a circuit diagram of a GOA circuit according to an embodiment of this disclosure.
Figure 2:
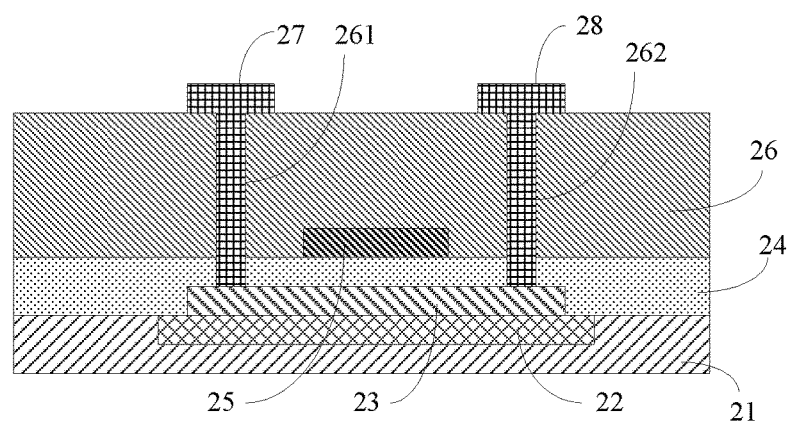
FIG. 2 is a schematic view of the structure of a thin film transistor in FIG. 1.

Referring to FIGS. 1 and 2, FIG. 1 is a circuit diagram of a GOA circuit according to an embodiment of this disclosure; FIG. 2 is a schematic view of the thin film transistor in FIG. 1. As shown in FIG. 1, the GOA circuit 10 of the present embodiment includes a first thin film transistor T1, a second thin film transistor T2, a third thin film transistor T3, a fourth thin film transistor T4, a fifth thin film transistor T5, a sixth thin film transistor T6, A seventh thin film transistor T7, an eighth thin film transistor T8, a ninth thin film transistor T9, a tenth thin film transistor T10, an eleventh thin film transistor T11, a twelfth thin film transistor T12, a thirteenth thin film transistor T13, a fourteenth thin film transistor T14, a fifteenth thin film transistor T15, and a capacitor C.

A first terminal of the first thin film transistor T1 is input with a first control signal DCH, a second terminal of the first thin film transistor T1 is input with a second control signal ST(n−1), a third terminal of the first thin film transistor T1 is respectively connected with a first terminal and a second terminal of the second thin film transistor T2, a second terminal of the third thin film transistor T3, a second terminal of the fourth thin film transistor T4, and one terminal of the capacitor C. A third terminal of the second thin film transistor T2 is connected with a first terminal of the fifth thin film transistor T5; a first terminal of the third thin film transistor T3 and a first terminal of the fourth thin film transistor T4 are input with a first clock signal CK(n), and a third terminal of the thin film transistor T3 is connected with a latter GOA circuit, so as to output a third control signal to the latter stage ST (n+1).

A third terminal of the fourth thin film transistor T4 outputs the scanning signal G(n); a second terminal of the fifth thin film transistor T5 is input with a second input clock signal XCK(n), a third terminal of the fifth thin film transistor T5 is connected with the other terminal of the capacitor C and the third terminal of the fourth thin film transistor T4.

A first terminal and a second terminal of the sixth thin film transistor T6 are input with the first control signal DCH, a third terminal of the sixth thin film transistor T6 is connected with the first terminal of the seventh thin film transistor T7, the second terminal of the eighth thin film transistor T8, and a second terminal of the tenth thin film transistor T10; a second terminal of the seventh thin film transistor T7 and a second terminal of the ninth transistor T9 are connected with a second terminal of the third thin film transistor T3, a third terminal of the seventh thin film transistor T7 is input with a first reference voltage V1.

A first terminal of the eighth thin film transistor T8, a first terminal of the tenth thin film transistor T10, and a first terminal of the twelfth thin film transistor T12 are connected with a first terminal of the sixth thin film transistor T6, a third terminal of the eighth thin film transistor T8 is connected with a first terminal of the ninth thin film transistor T9, a second terminal of the thirteenth thin film transistor T13, a second terminal of the fourteenth thin film transistor T14, and a second terminal of the fifteenth thin film transistor T15; a third terminal of the ninth thin film transistor T9 is connected with a third terminal of the tenth thin film transistor T10 and a first terminal of the eleventh thin film transistor T11; a second terminal of the eleventh thin film transistor T11 is connected with a second terminal of the twelfth thin film transistor T12 and a second terminal of the third thin film transistor T3, and a third terminal of the eleventh thin film transistor T11 and a third terminal of the fourteenth thin film transistor T14 are input with a second reference voltage V2.

A third terminal of the twelfth thin film transistor T12 is connected with a third terminal of the thirteenth thin film transistor T13, and a first terminal of the fourteenth thin film transistor T14; the first terminal of the thirteenth thin film transistor T13 is connected with the first thin film transistor T1; a first terminal of the fifteenth thin film transistor T15 is connected with the third terminal of the fifth thin film transistor T5, and the third terminal of the fifteenth thin film transistor T15 is input with the first reference voltage V1.

The first thin film transistor T1, the second thin film transistor T2, the third thin film transistor T3, the fourth thin film transistor T4, the fifth thin film transistor T5, the sixth thin film transistor T6, the seventh thin film transistor T7, the eighth thin film transistor T8, The ninth thin film transistor T9, the tenth thin film transistor T10, the eleventh thin film transistor T11, the twelfth thin film transistor T12, the thirteenth thin film transistor T13, the fourteenth thin film transistor T14, and the fifteenth thin film transistor T15 are all P-type thin film transistor; and the first terminal is a source, the second terminal is a gate, and the third terminal is a drain. In other embodiments, the first thin film transistor T1, the second thin film transistor T2, the third thin film transistor T3, the fourth thin film transistor T4, the fifth thin film transistor T5, the sixth thin film transistor T6, the seventh thin film transistor T7, the eighth thin film transistor T8, the ninth thin film transistor T9, the tenth thin film transistor T10, the eleventh thin film transistor T11, the twelfth thin film transistor T12, the thirteenth thin film transistor T13, the fourth four thin film transistor T14, and the fifteenth thin film transistor T15 are all N-type thin film transistors and will not be described herein.

The GOA circuit 10 includes a plurality of thin film transistors, the thin film transistors are disposed on a substrate, the thin film transistor including at least a metal shading layer and a semiconductor layer sequentially arranged on the substrate, the metal shading layers of the plurality of thin film transistors are all input in ground signal Ground.

The GOA circuit 10 of the present embodiment includes 15 thin film transistors, and the structure of the 15 thin film transistors is the same; as shown in FIG. 2, each thin film transistor includes:

a metal shading layer 22, disposed on the substrate 21, an IGZO (indium gallium zinc oxide) layer 23, i.e., a semiconductor layer, disposed on the metal shading layer 22, an insulating layer 24, disposed on the substrate 21, the metal light shading layer 22, and the IGZO layer 23;

a gate layer 25, disposed on the insulating layer 24;

an interlayer dielectric layer (ILD) 26, disposed on the gate layer 25 and the insulating layer 24;

a source layer 27 and a drain layer 28, disposed on the interlayer dielectric layer 26;

a first through hole 261 and the second through hole 262 are provided in the interlayer dielectric layer 26 and the insulating layer 24, the source electrode layer 27 is connected with the IGZO layer 23 by the first through hole 261, and the drain layer 28 is connected with the IGZO layer 23 by the second through hole 262.

Wherein the metal shading layer 22 is disposed on the light entrance surface of the IGZO layer 23 so that the metal shading layer 22 is used to block light for IGZO layer 23 to prevent the IGZO layer 23 from causing an electrical failure in the light.

Figure 3:
FIG. 3 is a schematic diagram of a scanning signal in the prior art.

In the prior art, the metal shading layer and the gate layer, the metal shading layer and the source layer, and the metal shading layer and the drain layer may form a coupling capacitance, so that the waveform of the output scanning signal of the GOA circuit in the prior art is affected by the coupling effect, causing the waveform distortion of the scanning signal, as shown in FIG. 3.

Figure 4:
FIG. 4 is a schematic diagram of the normal output of the scanning signal in FIG. 1.
Figure 5:
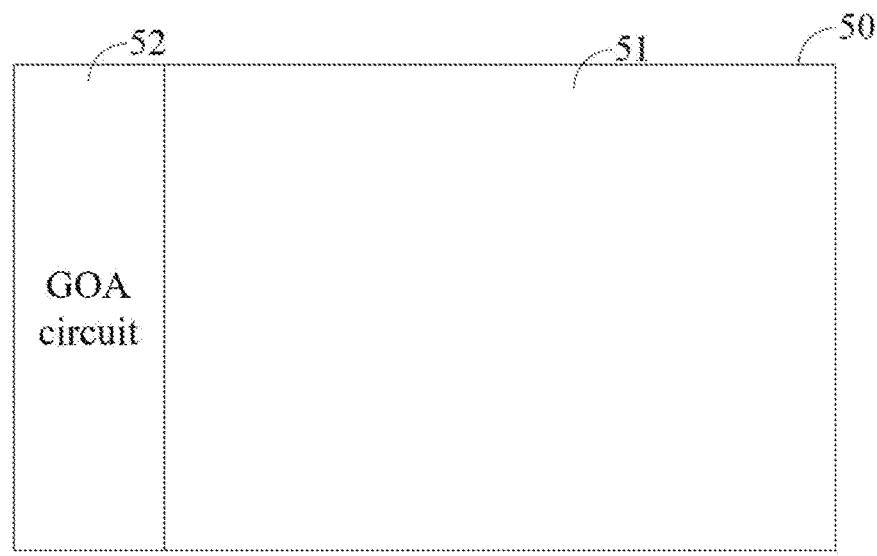
FIG. 5 is a schematic structural diagram of a display device according to an embodiment of this disclosure.

The GOA circuit with respect to the prior art, metal shading layers of the plurality of thin film transistors according to the embodiment are all input with ground signal Ground, that is, the 15 metal shading layers 22 of the thin film transistors are input with the ground signals Ground, the metal shading layer 22 cannot be stored, thus the metal shading layer 22 and the gate layer 25, the metal shading layer 22 and the source layer 27, and the metal shading layer 22 and the drain layer 28 cannot form coupling capacitors, thereby ensuring that the GOA circuit 10 normally outputs the scanning signal G(n), and a waveform diagram of the scanning signal G(n) is shown in FIG. 4.

The metal shading layers of the plurality of thin film transistors of the present embodiment are connected together, that is, the 15 metal shading layers 22 of the thin film transistors are connected together and are grounded, and thus are input with the ground signal Ground, as shown in FIG. 1. Specifically, the metal shading layers 22 of the first thin film transistor T1, the second thin film transistor T2, the third thin film transistor T3, the fourth thin film transistor T4, the fifth thin film transistor T5, the sixth thin film transistor T6, the seventh thin film transistor T7, the eighth thin film transistor T8, the ninth thin film transistor T9, the tenth thin film transistor T10, the eleventh thin film transistor T11, the twelfth thin film transistor T12, the thirteenth thin film transistor T13, the fourteenth thin film transistor T14, the thin film the thin film transistor T15 are all grounded.

Thus, the thin film transistor on the substrate of the present embodiment is provided with a metal shading layer 22, applied to block light for the IGZO layer 23 of the thin film transistor, thereby avoiding electrical failure of the IGZO layer 23; and the metal shading layers 22 of the plurality of thin film transistors are all input with a ground signal to avoid the coupling effect between the metal shading layer and the gate layer, the drain layer, or the source layer to ensure that the GOA circuit 10 outputs signals normally.

This disclosure further provides a display device, the display device 50 includes a display area 51 and the GOA circuit 52, and the GOA circuit 52 is applied to generate a drive signal, and the drive signal is applied to drive the display area 51, wherein the GOA circuit 52 is the GOA circuit 10 as the embodiment, and will not be described herein.

In summary, the thin film transistor of this disclosure is provided with a metal light shading layer on the substrate applied to block light for the semiconductor layer of the thin film transistor, thereby avoiding the electrical failure of the semiconductor layer; the metal shading layer of the plurality of thin film transistors Signal, to avoid the metal shading layer to produce coupling effect, to ensure that the GOA circuit output signals normally.

Above are only embodiments of the disclosure is not patented and therefore limit the scope of the disclosure, the use of any content of the present specification and drawings made equivalent or equivalent structural transformation process, either directly or indirectly related to the use of other technologies areas are included in the same way the scope of the patent protection of the disclosure.

What is claimed is:

1. A Gate Driver on Array (GOA) circuit, wherein the GOA circuit comprises a plurality of thin film transistors, and the thin film transistors are disposed on a substrate, and each of the plurality of thin film transistors comprises at least a metal shading layer and a semiconductor layer sequentially arranged on the substrate, and the metal shading layers of the plurality of thin film transistors are all input in ground signal, and the metal shading layers of the plurality of thin film transistors are connected together;

wherein the semiconductor layer is an Indium Gallium Zinc Oxide (IGZO) layer, the thin film transistor further comprises:

an insulating layer, disposed on the substrate, the metal shading layer, and the IGZO layer;

a gate layer, disposed on the insulating layer;

an interlayer dielectric layer, disposed on the gate layer and the insulating layer; and a source layer and a drain layer, disposed on the interlayer dielectric layer;

wherein the interlayer dielectric layer and the insulating layer are provided with a first through hole and a second through hole, the source layer is connected with the IGZO layer through the first through hole, and the second through hole is connected with the IGZO layer;

the GOA circuit comprises a first thin film transistor, a second thin film transistor, a third thin film transistor, a fourth thin film transistor, a fifth thin film transistor, a sixth thin film transistor, a seventh thin film transistor, an eighth thin film transistor, a ninth thin film transistor, a tenth thin film transistor, an eleventh thin film transistor, a twelfth thin film transistor, a thirteenth thin film transistor, a fourteenth thin film transistor, a fifteenth thin film transistor, and a capacitor;

a first terminal of the first thin film transistor is input with a first control signal, a second terminal of the first thin film transistor is input with a second control signal, and a third terminal of the first thin film transistor is respectively connected with a first terminal and a second terminal of the second thin film transistor, a second terminal of the third thin film transistor, a second terminal of the fourth thin film transistor, and one terminal of the capacitor;

a third terminal of the second thin film transistor is connected with a first terminal of the fifth thin film transistor;

a first terminal of the third thin film transistor and a first terminal of the fourth thin film transistor are input with a first clock signal, and a third terminal of the third thin film transistor is connected with a GOA circuit of a latter stage;

a third terminal of the fourth thin film transistor outputs a scanning signal;

a second terminal of the fifth thin film transistor is input with a second clock signal, and a third terminal of the fifth thin film transistor is connected with other terminal of the capacitor and the third terminal of the fourth thin film transistor;

a first terminal and a second terminal of the sixth thin film transistor input the first control signal, and a third terminal of the sixth thin film transistor is connected with a first terminal of the seventh thin film transistor, a second terminal of the eighth thin film transistor, and a second terminal of the tenth thin film transistor;

a second terminal of the seventh thin film transistor and a second terminal of the ninth thin film transistor are connected with the second terminal of the third thin film transistor, and a third terminal of the seventh thin film transistor is input with a first reference voltage;

a first terminal of the eighth thin film transistor, a first terminal of the tenth thin film transistor and a first terminal of the twelfth thin film transistor are connected with the first terminal of the sixth thin film transistor, and a third terminal of the eighth thin film transistor is connected with a first terminal of the ninth thin film transistor, a second terminal of the thirteenth thin film transistor, a second terminal of the fourteenth thin film transistor, and a second terminal of the fifteenth thin film transistor;

a third terminal of the ninth thin film transistor is connected with a third terminal of the tenth thin film transistor and a first terminal of the eleventh thin film transistor;

a second terminal of the eleventh thin film transistor is connected with a second terminal of the twelfth thin film transistor and the second terminal of the third thin film transistor, and a third terminal of the eleventh thin film transistor and a third terminal of the tenth thin film transistor, the third terminal of the fourteen thin film transistor is input with a second reference voltage;

a third terminal of the twelfth film transistor is connected with a third terminal of the thirteenth thin film transistor and a first terminal of the fourteenth thin film transistor;

a first terminal of the thirteenth thin film transistor is connected with a third terminal of the first thin film transistor;

the first terminal of the fifteenth thin film transistor is connected with a third terminal of the fifth thin film transistor, and the third terminal of the fifteenth thin film transistor is input with the first reference voltage.

2. The GOA circuit according to claim 1, wherein the metal shading layers of the first to fifteenth thin film transistors are all grounded.

3. The GOA circuit according to claim 1, wherein the first to fifteenth thin film transistors are P-type thin film transistors, and the first terminals are source electrodes, the second terminals are gate electrodes, and the third terminals are drain electrodes.

4. The GOA circuit according to claim 1, wherein the first to fifteenth thin film transistors are N-type thin film transistors.

5. A Gate Driver on Array (GOA) circuit, wherein the GOA circuit comprises a plurality of thin film transistors, the thin film transistors are disposed on a substrate, and each of the plurality of thin film transistors comprises at least a metal shading layer and a semiconductor layer sequentially arranged on the substrate, and the metal shading layers of the plurality of thin film transistors are all input in ground signal;

the GOA circuit comprises a first thin film transistor, a second thin film transistor, a third thin film transistor, a fourth thin film transistor, a fifth thin film transistor, a sixth thin film transistor, a seventh thin film transistor, an eighth thin film transistor, a ninth thin film transistor, a tenth thin film transistor, an eleventh thin film transistor, a twelfth thin film transistor, a thirteenth thin film transistor, a fourteenth thin film transistor, a fifteenth thin film transistor, and a capacitor;

a first terminal of the first thin film transistor is input with a first control signal, a second terminal of the first thin film transistor is input with a second control signal, and a third terminal of the first thin film transistor is respectively connected with the second thin film transistor and a second terminal of the third thin film transistor, a second terminal of the fourth thin film transistor, and one terminal of the capacitor;

a third terminal of the second thin film transistor is connected with a first terminal of the fifth thin film transistor;

a first terminal of the third thin film transistor and a first terminal of the fourth thin film transistor are input with a first clock signal, a third terminal of the third thin film transistor is connected with a GOA circuit of a latter stage;

a third terminal of the fourth thin film transistor outputs a scanning signal;

a second terminal of the fifth thin film transistor is input with a second clock signal, a third terminal of the fifth thin film transistor is connected with other terminal of the capacitor and the third terminal of the fourth thin film transistor;

a first terminal and a second terminal of the sixth thin film transistor input the first control signal, and a third terminal of the sixth thin film transistor is connected with a first terminal of the seventh thin film transistor, a second terminal of the eighth thin film transistor, and a second terminal of the tenth thin film transistor;

a second terminal of the seventh thin film transistor and a second terminal of the ninth thin film transistor are connected with the second terminal of the third thin film transistor, and a third terminal of the seventh thin film transistor is input with a first reference voltage;

a first terminal of the eighth thin film transistor, a first terminal of the tenth thin film transistor, and a first terminal of the twelfth thin film transistor are connected with a first terminal of the sixth thin film transistor, and a third terminal of the eighth thin film transistor is connected with a first terminal of the ninth thin film transistor, a second terminal of the thirteenth thin film transistor, a second terminal of the fourteenth thin film transistor, and a second terminal of the fifteenth thin film transistor;

a third terminal of the ninth thin film transistor is connected with a third terminal of the tenth thin film transistor and a first terminal of the eleventh thin film transistor;

a second terminal of the eleventh thin film transistor is connected with a second terminal of the twelfth thin film transistor and the second terminal of the third thin film transistor, and a third terminal of the eleventh thin film transistor and the third terminal of the fourteen thin film transistor is input with a second reference voltage;

a third terminal of the twelfth film transistor is connected with a third terminal of the thirteenth thin film transistor and a first terminal of the fourteenth thin film transistor;

a first terminal of the thirteenth thin film transistor is connected with the third terminal of the first thin film transistor;

a first terminal of the fifteenth thin film transistor is connected with the third terminal of the fifth thin film transistor, and the third terminal of the fifteenth thin film transistor is input to the first reference voltage.

6. The GOA circuit according to claim 5, wherein the metal shading layers of the plurality of thin film transistors are connected together.

7. The GOA circuit according to claim 5, wherein the semiconductor layer is an Indium Gallium Zinc Oxide (IGZO) layer, and the thin film transistor further comprises:

an insulating layer, disposed on the substrate, the metal shading layer, and the IGZO layer;

a gate layer, disposed on the insulating layer;

an interlayer dielectric layer, disposed on the gate layer and the insulating layer; and a source layer and a drain layer, disposed on the interlayer dielectric layer;

wherein the interlayer dielectric layer and the insulating layer are provided with a first through hole and a second through hole, and the source layer is connected with the IGZO layer through the first through hole, and the second through hole is connected with the IGZO layer.

8. The GOA circuit according to claim 5, wherein the metal shading layers of the first to fifteenth thin film transistors are all grounded.

9. The GOA circuit according to claim 5, wherein the first to fifteenth thin film transistors are P-type thin film transistors, and the first terminals are source electrodes, the second terminals are gate electrodes, and the third terminals are drain electrodes.

10. The GOA circuit according to claim 5, wherein the first to fifteenth thin film transistors are N-type thin film transistors.

11. A display device, wherein the display device comprises a Gate Driver on Array (GOA) circuit applied to generate a drive signal, and the GOA circuit comprises a plurality of thin film transistors, and the thin film transistors are disposed on a substrate, and each of the plurality of thin film transistors comprises at least a metal shading layer and a semiconductor layer sequentially arranged on the substrate, and the metal shading layers of the plurality of thin film transistors are all input in ground signal;

the GOA circuit comprises a first thin film transistor, a second thin film transistor, a third thin film transistor, a fourth thin film transistor, a fifth thin film transistor, a sixth thin film transistor, a seventh thin film transistor, an eighth thin film transistor, a ninth thin film transistor, a tenth thin film transistor, an eleventh thin film transistor, a twelfth thin film transistor, a thirteenth thin film transistor, a fourteenth thin film transistor, a fifteenth thin film transistor, and a capacitor;

a first terminal of the first thin film transistor is input with a first control signal, a second terminal of the first thin film transistor is input with a second control signal, and a third terminal of the first thin film transistor is respectively connected with the second thin film transistor and a second terminal of the third thin film transistor, a second terminal of the fourth thin film transistor, and one terminal of the capacitor;

a third terminal of the second thin film transistor is connected with a first terminal of the fifth thin film transistor;

a first terminal of the third thin film transistor and a first terminal of the fourth thin film transistor are input with a first clock signal, a third terminal of the third thin film transistor is connected with a GOA circuit of a latter stage;

a third terminal of the fourth thin film transistor outputs a scanning signal;

a second terminal of the fifth thin film transistor is input with a second clock signal, a third terminal of the fifth thin film transistor is connected with other terminal of the capacitor and the third terminal of the fourth thin film transistor;

a first terminal and a second terminal of the sixth thin film transistor input the first control signal, and a third terminal of the sixth thin film transistor is connected with a first terminal of the seventh thin film transistor, a second terminal of the eighth thin film transistor, and a second terminal of the tenth thin film transistor;

a second terminal of the seventh thin film transistor and a second terminal of the ninth thin film transistor are connected with the second terminal of the third thin film transistor, and a third terminal of the seventh thin film transistor is input with a first reference voltage;

a first terminal of the eighth thin film transistor, a first terminal of the tenth thin film transistor, and a first terminal of the twelfth thin film transistor are connected with a first terminal of the sixth thin film transistor, and a third terminal of the eighth thin film transistor is connected with a first terminal of the ninth thin film transistor, a second terminal of the thirteenth thin film transistor, a second terminal of the fourteenth thin film transistor, and a second terminal of the fifteenth thin film transistor;

a third terminal of the ninth thin film transistor is connected with a third terminal of the tenth thin film transistor and a first terminal of the eleventh thin film transistor;

a second terminal of the eleventh thin film transistor is connected with a second terminal of the twelfth thin film transistor and the second terminal of the third thin film transistor, and a third terminal of the eleventh thin film transistor and the third terminal of the fourteen thin film transistor is input with a second reference voltage;

a third terminal of the twelfth film transistor is connected with a third terminal of the thirteenth thin film transistor and a first terminal of the fourteenth thin film transistor;

a first terminal of the thirteenth thin film transistor is connected with the third terminal of the first thin film transistor;

a first terminal of the fifteenth thin film transistor is connected with the third terminal of the fifth thin film transistor, and the third terminal of the fifteenth thin film transistor is input to the first reference voltage.

12. The display device according to claim 11, wherein the metal shading layers of the plurality of thin film transistors are connected together.

13. The display device according to claim 11, wherein the semiconductor layer is an Indium Gallium Zinc Oxide (IGZO) layer, and the thin film transistor further comprises:
   an insulating layer, disposed on the substrate, the metal shading layer, and the IGZO layer;
   a gate layer, disposed on the insulating layer;
   an interlayer dielectric layer, disposed on the gate layer and the insulating layer;
   and a source layer and a drain layer, disposed on the interlayer dielectric layer;
   wherein the interlayer dielectric layer and the insulating layer are provided with a first through hole and a second through hole, the source layer is connected with the IGZO layer through the first through hole, and the second through hole is connected with the IGZO layer.

* * * * *